US009246457B2

(12) United States Patent
Kawaguchi

(10) Patent No.: US 9,246,457 B2
(45) Date of Patent: Jan. 26, 2016

(54) AMPLIFYING DEVICE

(71) Applicant: ONKYO CORPORATION, Osaka (JP)

(72) Inventor: Tsuyoshi Kawaguchi, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 256 days.

(21) Appl. No.: 13/963,549

(22) Filed: Aug. 9, 2013

(65) Prior Publication Data

US 2014/0056444 A1    Feb. 27, 2014

(30) Foreign Application Priority Data

Aug. 24, 2012    (JP) .................. 2012-185450

(51) Int. Cl.
| | | |
|---|---|---|
| *H03F 99/00* | (2009.01) | |
| *H03F 3/217* | (2006.01) | |
| *H03F 3/68* | (2006.01) | |
| *H03F 3/72* | (2006.01) | |

(Continued)

(52) U.S. Cl.
CPC ............. *H03F 21/00* (2013.01); *H03F 3/217* (2013.01); *H03F 3/68* (2013.01); *H03F 3/72* (2013.01); *H04S 3/008* (2013.01)

(58) Field of Classification Search
CPC ........ H04R 5/04; H04R 2420/03; H04R 3/12; H04R 2420/05; H04R 3/007; H04R 5/02; H04S 3/00; H03F 3/68; H03F 3/217; H03F 1/305; H03F 2200/03
USPC ............. 381/120, 123, 18, 28, 104, 102, 307; 330/10
See application file for complete search history.

(56) References Cited

U.S. PATENT DOCUMENTS

| | | | | |
|---|---|---|---|---|
| 4,176,252 A | * | 11/1979 | Dutkovich | .................... 381/107 |
| 2006/0290550 A1 | * | 12/2006 | Lee | ............................. 341/144 |
| 2008/0037807 A1 | | 2/2008 | Honda | |

FOREIGN PATENT DOCUMENTS

| | | |
|---|---|---|
| JP | 2003-204590 | 7/2003 |
| JP | 2004-056254 | 2/2004 |

(Continued)

OTHER PUBLICATIONS

Texas Instruments; Data Sheet for TAS5142, "Stereo Digital Amplifier Power Stage", SLES126B, Dec. 2004—Revised May 2005, 31 pages.

(Continued)

*Primary Examiner* — Paul S Kim
*Assistant Examiner* — Norman Yu
(74) *Attorney, Agent, or Firm* — Renner, Otto, Boisselle & Sklar, LLP

(57) ABSTRACT

An amplifying device is provided that reduces power consumption and quickly starts amplification of an audio signal of a channel to be used. A control section 17 inputs a control signal for instructing operation or standby into post-amplifying sections 11b and 12b, and inputs a control signal for instructing standby to post-amplifying sections 13b and 14b. In the post-amplifying section 11b, when the control signal for instructing standby or operation is input from the control section 17, a modulation circuit 52 modulates the analog audio signal into a switching signal. An output stage circuit 54 amplifies the output signal. When the control signal for instructing the operation is input from the control section 17, a driving circuit 53 drives the output stage circuit 54 in response to the switching signal, and stops the driving of the output stage circuit 54 when the control signal for instructing standby is input.

3 Claims, 5 Drawing Sheets

(51) Int. Cl.
*H04S 3/00* (2006.01)
*H04R 5/02* (2006.01)

(56) References Cited

FOREIGN PATENT DOCUMENTS

| JP | 2009-211802 | 9/2009 |
| JP | 2012-060269 | 3/2012 |
| WO | WO 2012-032390 A1 | 3/2012 |

OTHER PUBLICATIONS

Honda et al., "Application Note AN 1138 IRS2092(S) Functional Description", International Rectifier, URL:http://www.irf.com/technical-info/appnotes/an-1138.pdf.

* cited by examiner

AMPLIFYING DEVICE

BACKGROUND OF THE INVENTION

1. Field of the Invention

The present invention relates to an amplifying device, and more specifically relates to the amplifying device for amplifying audio signals of a plurality of channels.

2. Description of the Related Art

Audio signals of a surround system have a plurality of channels. Some types of digital amplifiers can amplify audio signals of respective channels respectively. Such digital amplifiers have amplifying sections corresponding to channels, respectively, and each of the amplifying sections modulates an audio signal (analog signal) of corresponding channel into a digital signal so as to amplify it.

Since a number of surround system channels varies from 2.1 ch to 7.1 ch, the digital amplifiers do not amplify audio signals of all channels in some cases. For this reason, the digital amplifiers need to be controlled so that the amplifying sections corresponding to unused channels do not amplify audio signals.

Each of the amplifying sections of each channel uses MOSFET (Metal-Oxide-Semiconductor Field-Effect Transistor) in order to amplify a digital signal obtained by modulating an analog signal (audio signal). Driving ICs for driving the MOSFETs are provided by various vendors. Non-Patent Document discloses a driving IC "IRS2092" manufactured by International Rectifier "Application Note AN-1138 IRS2092(S) Functional Description", Searched on Jul. 18, 2012, Internet <URL:http://www.irf.com/technical-info/appnotes/an-1138.pdf>.

Japanese Patent Application Laid-Open No. 2012-60269 describes an amplifier that can set channels to be amplified in a plurality of channels. In Japanese Patent Application Laid-Open No. 2012-60269, the amplifier includes a DSP (Digital Signal Processor), and a plurality of amplifying sections. The plurality of amplifying sections is related to channels, respectively, and includes a PWM (pulse width modulation) modulator and a switching section. The DSP inputs a digital signal and a carrier frequency into the amplifying section corresponding to a channel to be used, and inputs only the carrier frequency into the amplifying section related to an unused channel. In another manner, the DSP inputs signals for turning off the PWM modulator and the switching section into the amplifying section related to the unused channel.

In Japanese Patent Application Laid-Open No. 2012-60269, when the DSP inputs a carrier frequency into the amplifying section related to the unused channel, the switching section continues amplification in the amplifying section related to the unused channel. As a result, unnecessary radiation is caused, and power consumption increases.

The PWM modulator requires time until its operation is stable after the power is on. When the amplifying section related to the unused channel restarts amplification, the amplifying section cannot amplify an audio signal until the PWM modulator can stably operate.

SUMMARY OF THE INVENTION

It is an object of the present invention to provide an amplifying device that can reduce power consumption and can quickly start amplification of a signal for a channel to be used.

An amplifying device of the present invention comprises first to third amplifying sections and a control section. The first and second amplifying sections amplify audio signals of a pair of channels, respectively, so as to output output signals. The third amplifying section amplifies an audio signal of a channel different from the pair of channels so as to output an output signal. The control section inputs a control signal for instructing the first and second amplifying sections to stand by or operate into the first and second amplifying sections, and inputs a control signal for instructing the third amplifying section to stand by or operate into the third amplifying section. Each of the first to third amplifying sections includes a modulation circuit, an output stage circuit and a driving circuit. The modulation circuit modulates the audio signal into a switching signal when the control signal for instructing standby or the operation is input from the control section. The output stage circuit outputs the output signal. The driving circuit drives the output stage circuit in response to the switching signal when the control signal for instructing the operation is input from the control section. The driving circuit stops the driving of the output stage circuit when the control signal for instructing standby is input from the control section.

In the present invention, a control section inputs control signals for instructing first and second amplifying sections to stand by or operate into the first and second amplifying sections, and inputs a control signal for instructing a third amplifying section to stand by or operate into the third amplifying section. When each of the first to third amplifying sections stand by due to the input of the control signal for instructing standby from the control section, in each of the first to third amplifying sections, a modulation circuit operates, and a driving circuit stops driving of an output stage circuit. As a result, when each of the first to third amplifying sections stands by, power consumption can be reduced, and unnecessary radiation from the output stage circuit can be reduced. Further, the modulation circuit continues the operation even when each of the first to third amplifying sections stands by. For this reason, when the control signal for instructing the operation is input, the driving circuit can quickly start driving of the output stage circuit in response to a switching signal. Therefore, when the control signal for instructing the operation is input, each of the first to third amplifying sections can quickly start amplification.

Preferably, each of the first to third amplifying sections further includes an abnormality detecting circuit and an interface circuit. The abnormality detecting circuit detects abnormality occurring in the first to third amplifying sections. The interface circuit generates a protect signal representing occurrence of abnormality so as to output the signal to the control section when the control signal for instructing the operation is input from the control section and the abnormality detecting circuit detects abnormality. The interface circuit does not generate the protect signal when the control signal instructing standby is input whether or not the abnormality detecting circuit detects abnormality.

According to the present invention, when each of the first to third amplifying sections stands by, a protect signal representing occurrence of abnormality is not output to the control section. For this reason, a malfunction of the amplifying device can be prevented.

Preferably, the modulation circuit, the driving circuit, and the abnormality detecting circuit are mounted as an integrated circuit. The abnormality detecting circuit detects abnormality that occurs in the integrated circuit. The integrated circuit includes a control terminal and a voltage control circuit. The control terminal is connected to the interface circuit. The voltage control circuit controls a voltage of the control terminal to a first voltage range when the abnormality detecting circuit detects abnormality of the integrated circuit. The voltage control circuit operates the modulation circuit and the driving circuit so as to control the voltage of the control terminal to a second voltage range when the abnormality detecting circuit does not detect abnormality in the integrated circuit. The voltage control circuit operates the modulation circuit so as to stop the driving circuit when the voltage of the control terminal is in a third voltage range. The third voltage range is a predetermined voltage value range that is higher than a first voltage range and lower than a second voltage range. The interface circuit generates the protect signal when the control signal for instructing the operation is input from the control section and the voltage of the control terminal is in the first voltage range. The interface circuit inputs the voltage in the third voltage range into the control terminal when the control signal for instructing standby is input.

According to the present invention, the modulation circuit, the driving circuit, and an abnormality detecting circuit are mounted as an integrated circuit, and a control terminal of the integrated circuit is connected to an interface circuit. In the integrated circuit, when abnormality of the integrated circuit is detected, a voltage control circuit controls a voltage of the control terminal to the first voltage range. When the voltage of the control terminal is in the third voltage range, the voltage control circuit operates the modulation circuit so as to operate the driving circuit. When the control signal for instructing standby is input, the interface circuit inputs the voltage in the third voltage range into the control terminal. As a result, when the signal for instructing standby is input from the control section into the interface circuit, the voltage of the control terminal is maintained within the third voltage range. That is to say, when the signal for instructing standby is input from the control section, even if abnormality occurs in the integrated circuit, the interface circuit does not generate a protect signal. Even in a case where the modulation circuit and the driving circuit are mounted as the integrated circuit, the protect signal can be prevented from being output to the control section when the control signal for instructing standby is input into the interface circuit.

Preferably, the interface circuit includes a protect signal output terminal, a first transistor, a second transistor and a third transistor. The protect signal output terminal outputs the protect signal. The first transistor has a base into which the control signal is input, an emitter into which the voltage of the third voltage range is input, and a collector to be connected to the control terminal. The second transistor has a base into which the control signal is input and which is connected to the control terminal, an emitter into which the voltage in the third voltage range is input and a collector connected to a positive power supply. The third transistor has a base connected to the positive power supply and the collector of the second transistor, an emitter into which the voltage in the third voltage range is input and which is connected to the emitter of the second transistor, and a collector connected to the protect signal output terminal.

According to the present invention, the use of first to third transistors can create the interface circuit.

DETAILED DESCRIPTION OF THE PREFERRED EMBODIMENTS

Figure 1:
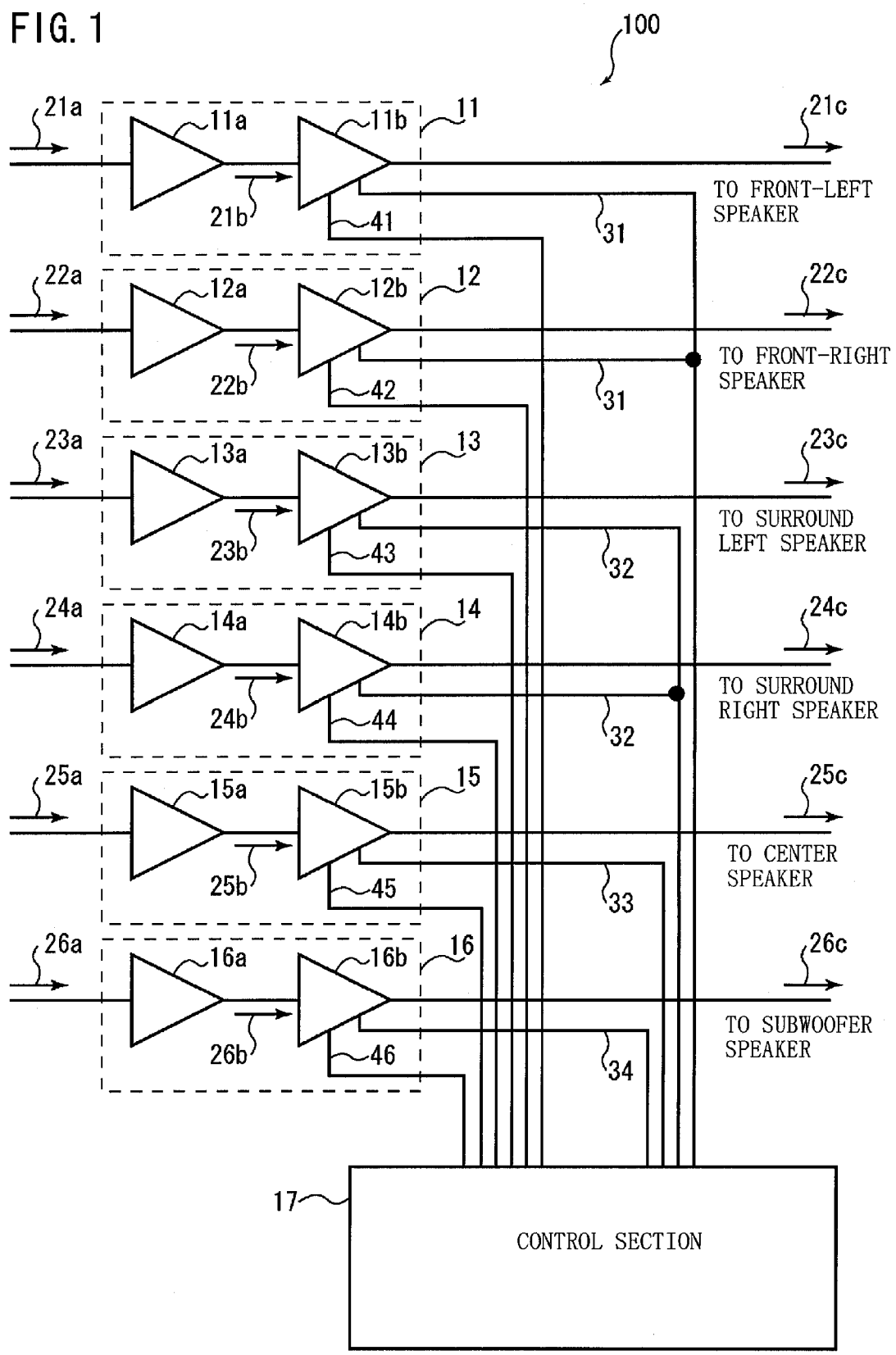
FIG. 1 is a function block diagram illustrating a constitution of an amplifying device according to an embodiment of the present invention.

An embodiment of the present invention is described in detail below with reference to the drawings. Like numbers in the drawings are denoted by like reference symbols, and description thereof is not repeated.

{Constitution of Amplifying Device 100}

FIG. 1 is a function block diagram illustrating an amplifying device 100 according to an embodiment of the present invention. The amplifying device 100 is a digital amplifier amplifying 5.1-channel analog audio signals of a surround system according to each channel.

When use of only a front speaker is instructed, the amplifying device 100 amplifies an analog audio signal related to a front speaker, and stops amplification of analog audio signals related to a surround speaker, a center speaker and a subwoofer speaker. When the amplifying device 100 is instructed to use the subwoofer speaker in addition to the front speaker, it amplifies an analog audio signal related to the subwoofer speaker. That is to say, a user can specify an analog audio signal to be amplified for each of the front speaker, the surround speaker, the center speaker, and the subwoofer speaker.

As shown in FIG. 1, the amplifying device 100 includes amplifying sections 11 to 16 and a control section 17. The control section 17 controls the amplifying sections 11 to 16.

The amplifying section 11 amplifies an analog audio signal 21a at front left and outputs an analog audio signal 21c. The amplifying section 12 amplifies an analog audio signal 22a at front right and outputs an analog audio signal 22c. The amplifying section 13 amplifies an analog audio signal 23a at surround left and outputs an analog audio signal 23c. The amplifying section 14 amplifies an analog audio signal 24a at surround right and outputs an analog audio signal 24c. The amplifying section 15 amplifies an analog audio signal 25a at center and outputs an analog audio signal 25c. The amplifying section 16 amplifies an analog audio signal 26a at subwoofer and outputs an analog audio signal 26c.

The amplifying section 11 includes a pre-amplifying section 11a and a post-amplifying section 11b. The pre-amplifying section 11a inversely amplifies the analog audio signal 21a and outputs an analog audio signal 21b. The post-amplifying section 11b inversely amplifies the analog audio signal 21b output from the pre-amplifying section 11a and outputs an analog audio signal 21c. The post-amplifying section 11b modulates the analog audio signal 21b according to the PWM system or a PDM (Pulse Density Modulation) system so as to amplify it.

The amplifying sections 12 to 16 have the similar constitution as that of the amplifying section 11. The amplifying sections 12 to 16 include pre-amplifying sections 12a to 16a, and post-amplifying sections 12b to 16b. The pre-amplifying sections 12a to 16a inversely amplify analog audio signals 22a to 26a, and output analog audio signals 22b to 26b. The post-amplifying sections 12b to 16b inversely amplify the analog audio signals 22b to 26b output from the pre-amplifying sections 12a to 16a, and outputs analog audio signals 22c to 26c. The post-amplifying sections 12b to 16b modulate the analog audio signals 22b to 26b according to the PWM system or the PDM system so as to amplify them.

The post-amplifying sections 11b and 12b are connected to the control section 17 via a control signal line 31. The post-amplifying sections 13b and 14b are connected to the control section 17 via a control signal line 32. The post-amplifying section 15b is connected to the control section 17 via a control signal line 33. The post-amplifying section 16b is connected to the control section 17 via a control signal line 34.

As a result, the control section 17 can control operations of the amplifying sections 11 to 16. For example, when the user operates the amplifying device 100 and instructs use of only the front speaker, the control section 17 inputs control signals for instructing the operation into the post-amplifying sections 11b and 12b via the control signal line 31. On the other hand, the control section 17 inputs control signals for instructing standby into the post-amplifying sections 13b to 16b via the control signal lines 32 to 34. The control section 17 can individually control the post-amplifying sections 11b and 12b related to the front speaker, the post-amplifying sections 13b and 14b related to the surround speaker, the post-amplifying section 15b related to the center speaker, and the post-amplifying section 16b related to the subwoofer speaker according to user's instructions. The controls of the post-amplifying sections 11b to 16b are described in detail later.

The post-amplifying sections 11b to 16b are connected to the control section 17 via protect signal lines 41 to 46. Protect signal lines 41 to 46 are used for inputting protect signals output from the post-amplifying sections 11b to 16b into the control section 17. The protect signals are signals representing whether abnormality occurs in the post-amplifying sections. When a protect signal representing that abnormality occurs is input from any one of the post-amplifying sections 11b to 16b, the control section 17 shuts down the amplifying device 100.

{Constitution of the Post-Amplifying Section}

Figure 2:
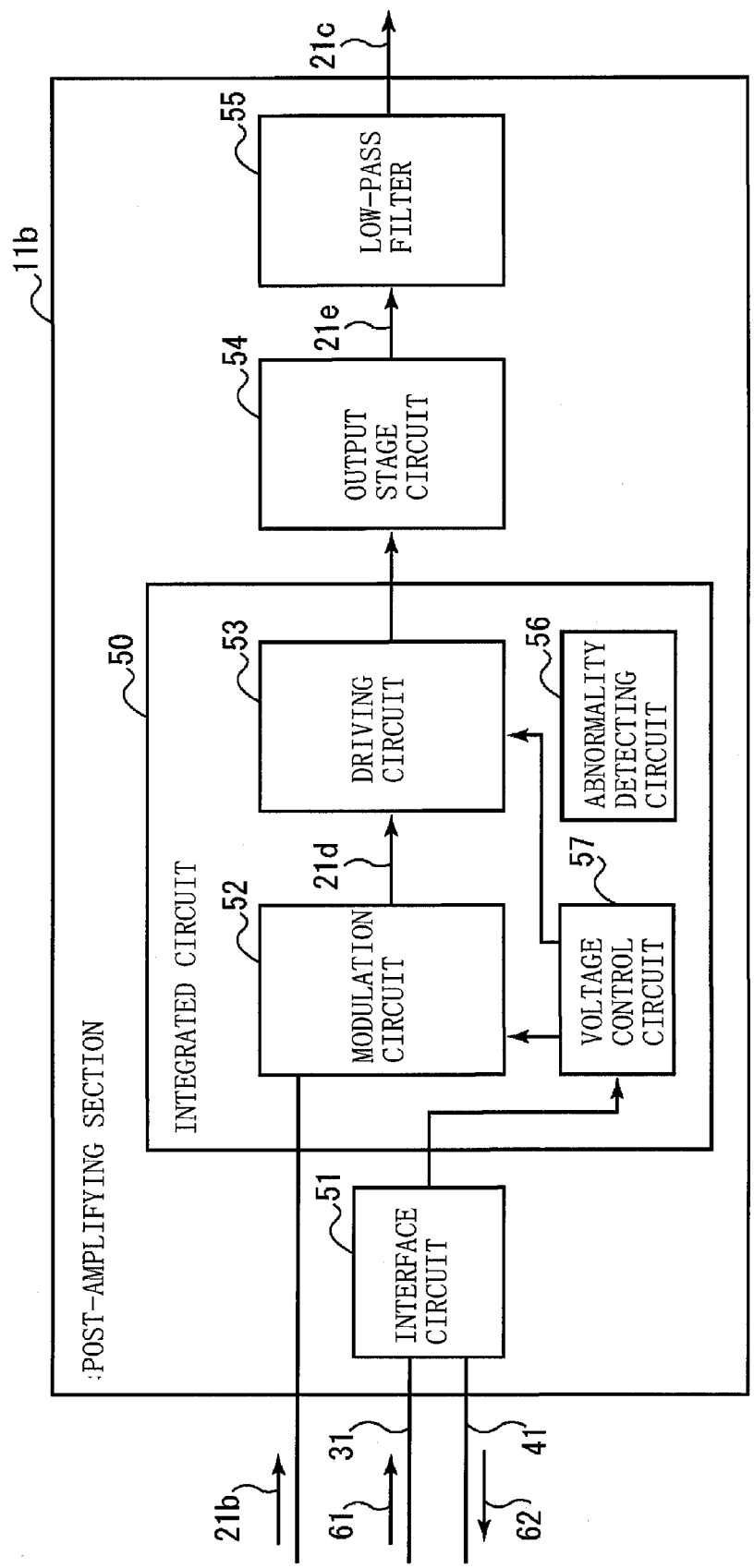
FIG. 2 is a function block diagram illustrating a constitution of a post-amplifying section shown in FIG. 1.

FIG. 2 is a function block diagram illustrating a constitution of the post-amplifying section 11b. The constitution of the post-amplifying section 11b connected to the front-left speaker is described in detail below with reference to FIG. 2. Since the constitutions of the post-amplifying sections 12b to 16b are the same as that of the post-amplifying section 11b, description thereof is omitted.

The post-amplifying section 11b includes an interface circuit 51, a modulation circuit 52, a driving circuit 53, an output stage circuit 54, and a low-pass filter 55. The modulation circuit 52 and the driving circuit 53 are mounted as an integrated circuit (IC) 50. As the integrated circuit 50, a digital audio amplifier driving IC, "IRS2092", provided by International Rectifier can be used. Hereinafter, the digital audio amplifier driving IC is simply called "driving IC".

The interface circuit 51 is connected to the control signal line 31 and a protect signal line 41. When a control signal 61 for instructing standby is input from the control signal line 31, the interface circuit 51 brings the integrated circuit 50 into a standby state. The interface circuit 51 outputs a protect signal 62 representing whether abnormality occurs in the integrated circuit 50 to the protect signal line 41.

The modulation circuit 52 modulates the analog audio signal 21b input into the post-amplifying section 11b into a switching signal 21d using the PWM system or the PDM system. The switching signal 21d is supplied to the driving circuit 53. The driving circuit 53 drives the output stage circuit 54 in response to the switching signal 21d supplied from the modulation circuit 52. The driving circuit 53 is a gate driver circuit for controlling MOSFET (not shown) of the output stage circuit 54. When the output stage circuit 54 is driven by the driving circuit 53, an output signal 21e of a switching type is output from the output stage circuit 54. The low-pass filter 55 converts the output signal 21e supplied from the output stage circuit 54 into the analog audio signal 21c.

The integrated circuit 50 includes an abnormality detecting circuit 56 and a voltage control circuit 57 as well as the modulation circuit 52 and the driving circuit 53. The abnormality detecting circuit 56 detects abnormally that occurs in the integrated circuit 50. The voltage control circuit 57 controls a voltage of a control terminal of the integrated circuit 50 and controls the operations of the modulation circuit 52 and the driving circuit 53. In the driving IC "IRS2092", the control terminal is a CSD terminal.

{Constitution of the Interface Circuit 51}

Figure 3:
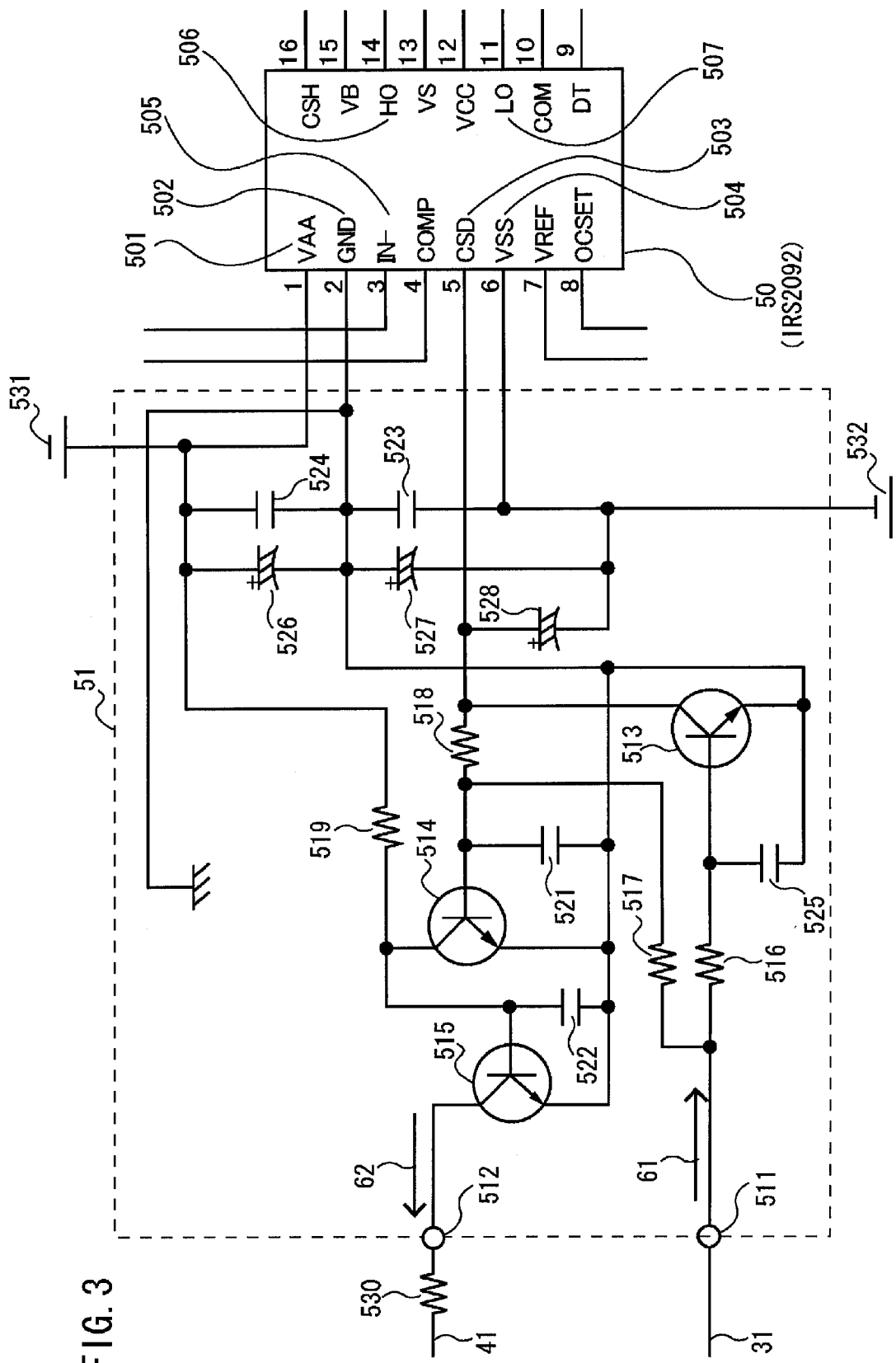
FIG. 3 is a circuit diagram illustrating a constitution of an interface circuit shown in FIG. 2.

FIG. 3 is a circuit diagram illustrating a constitution of the interface circuit 51. A terminal of the integrated circuit 50 connected to the interface circuit 51 is described with reference to FIG. 3.

Numbers described around the integrated circuit 50 are terminal numbers of the driving IC "IRS2092". FIG. 3 illustrates only circuit elements connected to a VAA terminal 501, a GND terminal 502, a CSD terminal 503, and a VSS terminal 504, and omits display of connection of the other terminals of IRS2092.

The VAA terminal 501 is a terminal for inputting a voltage on a plus side, and is connected to a positive power supply 531. The GND terminal 502 is a terminal for determining a reference voltage of the integrated circuit 50, and is grounded. The CSD terminal 503 is the control terminal for inputting a signal for controlling the operation of the integrated circuit 50. The VSS terminal 504 is a terminal for inputting a minus voltage, and is connected to a negative power supply 532.

An IN terminal 505 is a terminal for inputting the analog audio signal 21b. An HO terminal 506 is connected to a gate of one of two MOSFETs (not shown) provided in the output stage circuit 54. An LO terminal 507 is connected to a gate of the other MOSFET.

A constitution of the interface circuit 51 is described below. The interface circuit 51 includes a control signal input terminal 511, a protect signal output terminal 512, transistors 513 to 515, resistors 516 to 519, capacitors 521 to 525, and electrolytic capacitors 526 to 528.

The control signal input terminal 511 is connected to the control signal line 31. The control signal input terminal 511 is connected to a base of the transistor 513 via the resistor 516, and to a base of the transistor 514 via the resistor 517.

The base of the transistor 513 is connected to an emitter of the transistor 513 via the capacitor 525. The emitter of the transistor 513 is connected to the GND terminal 502. A collector of the transistor 513 is connected to the CSD terminal 503.

A base of the transistor 514 is connected to the CSD terminal 503 via the resistor 518, and to an emitter of the transistor 514 via the capacitor 521. The emitter of the transistor 514 is connected to the GND terminal 502. A collector of the transistor 514 is connected to the VAA terminal 501 and the positive power supply 531 via the resistor 519.

A base of the transistor 515 is connected to the collector of the transistor 514, and is connected to an emitter of the transistor 515 via the capacitor 522. The emitter of the transistor 515 is connected to the GND terminal 502. A collector of the transistor 515 is connected to the protect signal output terminal 512. The protect signal output terminal 512 is connected to the protect signal line 41 via a resistor 530.

The capacitor 524 and the electrolytic capacitor 526 are connected between the VAA terminal 501 and the GND terminal 502 in parallel. The capacitor 523 and the electrolytic capacitor 527 are connected between the GND terminal 502 and the VSS terminal 504 in parallel.

The electrolytic capacitor 528 is connected between the CSD terminal 503 and the VSS terminal 504.

{Control of the Post-Amplifying Section 11b}

Control of the post-amplifying section 11b by means of the control section 17 is described below.

The control section 17 inputs the control signal 61 into the post-amplifying section 11b via the control signal line 31, so as to control the operation of the post-amplifying section 11b. Concretely, the control section 17 inputs the control signal 61 for instructing standby into the post-amplifying section 11b, and brings the integrated circuit 50 into a standby state. The control section 17 inputs the control signal 61 for instructing the operation into the post-amplifying section 11b, so as to make the interface circuit 51 release the standby state of the integrated circuit 50. When the control signal 61 for instructing the operation is input and abnormality occurs in the integrated circuit 50, the interface circuit 51 generates the protect signal 62 representing occurrence of abnormality.

The standby state and the operating state of the integrated circuit 50 are described. In the integrated circuit 50 in the standby state, the modulation circuit 52 operates, and the driving circuit 53 stops. The modulation circuit 52 modulates the input analog audio signal 21b into the switching signal 21d. However, since the driving circuit 53 stops, the output stage circuit 54 does not operate, and the output signal 21e is not output from the output stage circuit 54.

In the integrated circuit 50 in the operating state, the modulation circuit 52 and the driving circuit 53 operate. The output stage circuit 54 is driven by the driving circuit 53 so as to output the output signal 21e to the low-pass filter 55. As a result, the front-left speaker (not shown) can output a sound according to the analog audio signal 21c.

When the front-left speaker is not used, the control section 17 outputs the control signal 61 instructing standby to the post-amplifying section 11b, so as to bring the integrated circuit 50 into the standby state. In the standby state, the voltage control circuit 57 stops the driving circuit 53. As a result, since the driving circuit 53 stops the driving of the output stage circuit 54, even when the analog audio signal 21c is input into the post-amplifying section 11b, the output signal 21e is not output from the output stage circuit 54. For this reason, when the front-left speaker is not used, power consumption of the post-amplifying section 11b can be reduced, and unnecessary radiation from the output stage circuit 54 can be reduced.

When the front-left speaker is used, the control section 17 inputs the control signal 61 for instructing the operation into the interface circuit 51. The interface circuit 51 releases the standby state of the integrated circuit 50. The integrated circuit 50 can transit from the standby state to the operating state. Concretely, when the voltage control circuit 57 operates the driving circuit 53, the driving circuit 53 starts to drive the output stage circuit 54. Since the modulation circuit 52 operates continuously from the standby state, the driving circuit 53 can quickly start to drive the output stage circuit 54 in response to the switching signal 21d supplied from the modulation circuit 52. Therefore, the post-amplifying section 11b can quickly start amplification of the analog audio signal 21b.

{Change in Voltage of the CSD Terminal 503}

Figure 4:
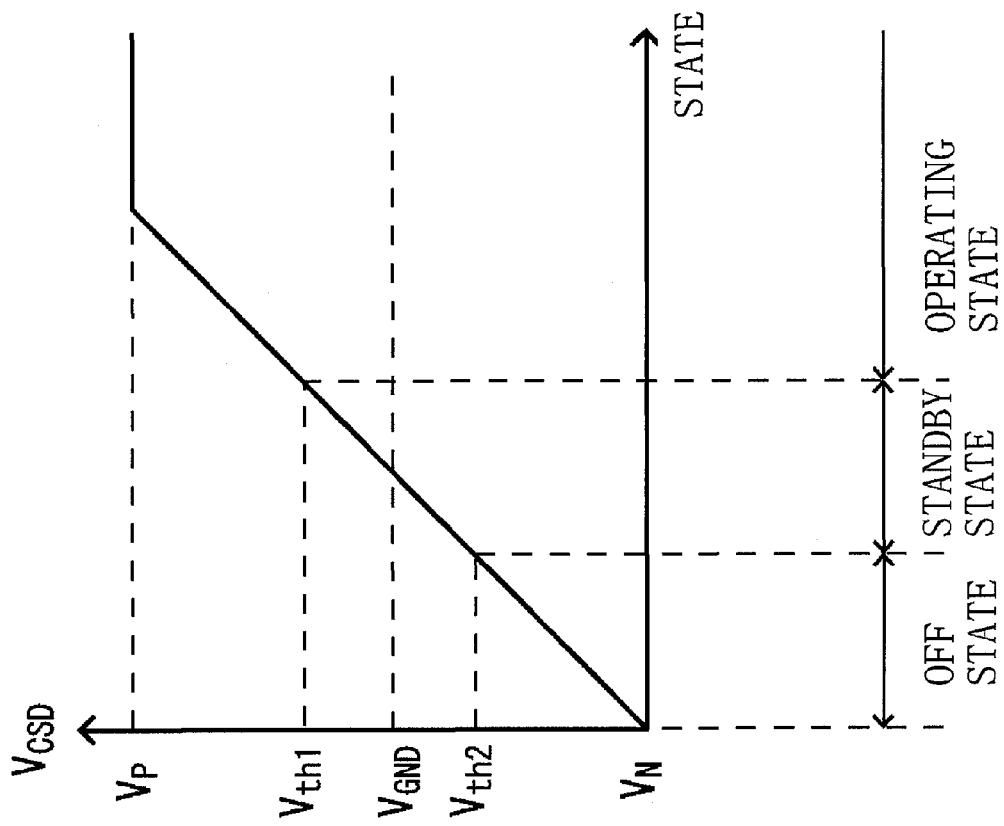
FIG. 4 is a graph illustrating an operation voltage of an integrated circuit shown in FIG. 2.

FIG. 4 is a graph illustrating a relationship between the voltage $V_{CSD}$ of the CSD terminal 503 and the operation of the integrated circuit 50. As shown in FIG. 4, the voltage $V_{CSD}$ is related to ON/OFF operations of the modulation circuit 52 and the driving circuit 53.

In FIG. 4, a vertical axis represents the voltage $V_{CSD}$. A horizontal axis represents the operation of the integrated circuit 50. $V_{GND}$ is a voltage (reference voltage) of the GND terminal 502. $V_P$ is a voltage of the positive power supply 531. $V_N$ is a voltage of the negative power supply 532.

When the voltage $V_{CSD}$ is within a range of $V_N$ to $V_{th2}$, the integrated circuit 50 is in an OFF state such that the operations of the modulation circuit 52 and the driving circuit 53 stop.

When the voltage $V_{CSD}$ is within a range of $V_{th2}$ to $V_{th1}$, in the integrated circuit 50, the modulation circuit 52 operates and the driving circuit 53 stops. That is to say, the voltage $V_{CSD}$ is controlled to a voltage (standby voltage) in the range of $V_{th2}$ to $V_{th1}$, so that the post-amplifying section 11b can be brought into the standby state.

When the voltage $V_{CSD}$ is $V_{th1}$ to $V_P$, in the integrated circuit 50, both the modulation circuit 52 and the driving circuit 53 operate. That is to say, when the voltage $V_{CSD}$ is in the range of $V_{th1}$ to $V_P$, the integrated circuit 50 is in the operating state.

Further, when the abnormality detecting circuit 56 detects abnormality in the integrated circuit 50, the voltage control circuit 57 pulls out electric charges from the electrolytic capacitor 528, and the voltage $V_{CSD}$ is reduced to $V_N$. That is to say, when the transistor 514 is turned off and the voltage $V_{CSD}$ has a predetermined value within a range of $V_{th2}$ to $V_{th1}$, the interface circuit 51 outputs the protect signal 62 representing occurrence of abnormality.

{Operation of the Interface Circuit 51}

When the control signal 61 instructing standby is input into the control signal input terminal 511, the interface circuit 51 controls the voltage $V_{CSD}$. A case where abnormality in the integrated circuit 50 is not detected is described below unless otherwise designated.

Figure 5:
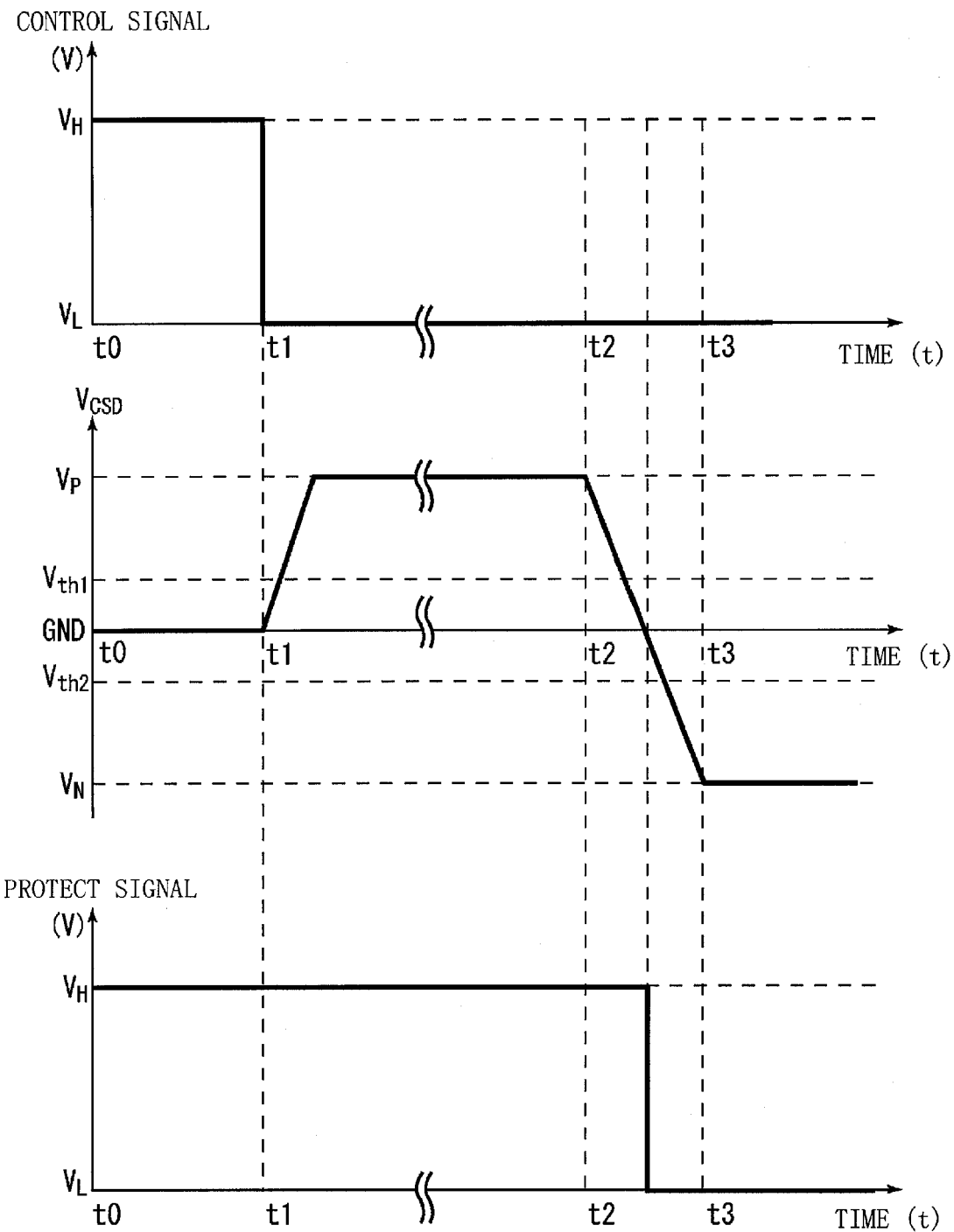
FIG. 5 is a graph illustrating a change in a voltage of a control signal shown in FIG. 3, a change in a voltage of a CSD terminal, and a change in a voltage of a protect signal.

FIG. 5 is a graph illustrating changes in the voltage of the control signal 61, the voltage of the protect signal 62 and the voltage $V_{CSD}$. At time t0, the control section 17 outputs the control signal 61 instructing standby to the post-amplifying section 11b. The voltage of the control signal 61 instructing standby is $V_H$. The voltage of the protect signal 62 is $V_H$ representing that abnormality does not occur in the integrated circuit 50.

As shown in FIG. 3 and FIG. 5, when the voltage of the control signal 61 is $V_H$, the transistor 513 is turned on. When the transistor 513 is turned on, the CSD terminal 503 is shunted to the GND terminal 502 via the transistor 513. As a result, the voltage $V_{CSD}$ is a reference voltage ($V_{GND}$). Since the reference voltage is within the range of $V_{th2}$ to $V_{th1}$, the integrated circuit 50 is brought into the standby state such that the modulation circuit 52 operates and the driving circuit 53 stops. When the control signal 61 instructing standby is input from the control section 17, the interface circuit 51 operates the modulation circuit 52, and inputs a standby voltage for stopping the driving circuit 53 into the CSD terminal 503.

When the voltage of the control signal 61 is $V_H$, the transistor 514 is turned on similarly to the transistor 513. Since the VAA terminal 501 is connected to the GND terminal 502 via the transistor 514 and the resistor 519, a voltage $V_P$ of the positive power supply 531 is not input into the base of the transistor 515. As a result, since the transistor 515 is turned off, the voltage of the protect signal output terminal 512 (the voltage of the protect signal 62) is $V_H$ representing that abnormality does not occur in the integrated circuit 50.

Therefore, when the control signal 61 instructing standby is input into the interface circuit 51 and the abnormality detecting circuit 56 detects abnormality in the integrated circuit 50, the interface circuit 51 does not generate the protect signal 62 representing that abnormality occurs in the integrated circuit 50. This is because since the CSD terminal 503 is shunted to the GND terminal 502, even when abnormality occurs in the integrated circuit 50, the voltage $V_{CSD}$ is not reduced to $V_N$ representing occurrence of abnormality in the integrated circuit 50. When the front-left speaker is not used, the protect signal 62 representing that abnormality occurs is not output from the post-amplifying section 11b. For this reason, a malfunction of the amplifying device 100 can be prevented.

At time t1, the control section 17 inputs the control signal 61 instructing the operation of the post-amplifying section 11b into the control signal input terminal 511. The voltage of the control signal 61 that instructs the operation is $V_L$. Since the voltage of the control signal input terminal 511 is $V_L$, the transistor 513 is turned off. The connection of the CSD terminal 503 to the GND terminal 502 is released. As a result, a constant current source (not shown) of the voltage control circuit 57 can supply electric charges to the electrolytic capacitor 528 connected between the CSD terminal 503 and the VSS terminal 504. When the electrolytic capacitor 528 is charged with electric charges, the voltage $V_{CSD}$ rises up to $V_P$ (operating voltage). When the voltage $V_{CSD}$ rises up to $V_P$, the integrated circuit 50 is brought into the operating state. When the control signal 61 instructing the operation is input, the interface circuit 51 releases the shunting of the CSD terminal 503. As a result, the voltage control circuit 57 can control the voltage of the CSD terminal 503.

Since the voltage $V_{CSD}$ that rises up to $V_P$ is input into the base of the transistor 514, the ON state of the transistor 514 and the OFF state of the transistor 515 continue. Since the transistor 515 is in the OFF state continuously from time t0, the voltage of the protect signal output terminal 512 is still $V_H$ representing that abnormality does not occur.

At time t2, it is assumed that the abnormality detecting circuit 56 detects abnormality in the integrated circuit 50. In this case, the OFF state of the transistor 513 continues. The constant current source inside the voltage control circuit 57 pulls out electric charges from the electrolytic capacitor 528. When the electric charges are pulled out from the electrolytic capacitor 528, the voltage $V_{CSD}$ reduces to $V_N$ at time t3.

When the voltage $V_{CSD}$ reduces to $V_N$, the transistor 514 is turned off, and a voltage $V_P$ of the positive power supply 531 is input into the base of the transistor 515. When the transistor 515 is turned on, the resistor 530 functions as a pull-down resistor, and thus the voltage of the protect signal output terminal 512 drops from $V_H$ to $V_L$ representing that occurrence of abnormality. Since the protect signal 62 representing occurrence of abnormality is input into the control section 17, the control section 17 determines that abnormality occurs in the post-amplifying section 11b, and powers off the amplifying device 100. As a result, the amplifying device 100 can be protected.

As described above, in the amplifying device 100, the control signal 61 instructing standby is input from the control section 17, the post-amplifying section 11b operates the modulation circuit 52, and stops the driving of the output stage circuit 54 by means of the driving circuit 53. When front-left channel is not used, the output stage circuit 54 is not driven, and thus power consumption and unnecessary radiation can be reduced. Further, when the control signal 61 instructing the operation is input into the post-amplifying section 11b from the control section 17, the driving circuit 53 can quickly start the driving of the output stage circuit 54 in response to the switching signal 21d.

The embodiment describes the example where the modulation circuit 52 and the driving circuit 53 are mounted as the integrated circuit 50, but the present invention is not limited to this. The modulation circuit 52, the driving circuit 53 and the output stage circuit 54 may be mounted as the integrated circuit 50. The modulation circuit 52 and the driving circuit 53 do not have to be mounted as the integrated circuit 50. That is to say, when the control signal 61 instructing standby is input from the control section 17, the post-amplifying section 11b operates the modulation circuit 52, and may stop the driving of the output stage circuit 54 by means of the driving circuit 53.

The embodiment describes the example where the amplifying sections 11 to 16 include the pre-amplifying sections 11a to 16a and the post-amplifying sections 11b to 16b, but the present invention is not limited to this. When the post-amplifying sections 11b to 16b non-inversely amplify the analog audio signals 21b to 26b, the amplifying sections 11 to 16 do not have to have the pre-amplifying sections 11a to 16a.

The above embodiment describes the example where the modulation circuit 52 modulates the analog audio signal 21b into the switching signal 21d using the PWM system or the PDM system, but the present invention is not limited to this. A audio signal supplied to the modulation circuit 52 is not the analog audio signal 21b but may be a digital audio signal. That is to say, the modulation circuit 52 may be a circuit for modulating the audio signal into a switching signal.

The embodiment describes the example where the amplifying device 100 can amplify a maximally 5.1-channel audio signal, but the present invention is not limited to this. The amplifying device 100 may include the plurality of post-amplifying sections for converting audio signals corresponding to respective channels into switching signals so as to amplify them.

The embodiment describes the example where the control signal 61 instructing standby is input into the interface circuit 51, the CSD terminal 503 is connected to the GND terminal 502, so that $V_{CSD}$ is controlled to a standby voltage, but the present invention is not limited to this. For example, a power supply (standby instructing power supply) for supplying a standby voltage may be provided in the post-amplifying section 11b. Further, the voltage supplied by the standby instructing power supply may be a predetermined value within the range of $V_{th2}$ to $V_{th1}$. When the control signal 61 instructing standby is input, the interface circuit 51 connects the standby instructing power supply to the CSD terminal 503. That is to say, when the control signal 61 instructing standby is input, the interface circuit 51 may input a standby voltage to the CSD terminal 503. Similarly, when a control signal for instructing the operation is input, the interface circuit 51 may maintain an operating voltage at the CSD terminal 503.

The embodiment of the present invention is described above, but the above embodiment is only an example for carrying out the present invention. Therefore, the present invention is not limited to the above embodiment, and the embodiment can be suitably changed without departing from the scope of the invention.

What is claimed is:

1. An amplifying device, comprising:
   first and second amplifying sections for amplifying first and second audio signals of a pair of channels, respectively, so as to output first and second output signals;
   a third amplifying section for amplifying a third audio signal of a channel different from the pair of channels so as to output a third output signal; and
   a control section for inputting a control signal for instructing the first and second amplifying sections to stand by or operate into the first and second amplifying sections, and inputting another control signal for instructing the third amplifying section to stand by or operate into the third amplifying section, wherein each of the first to third amplifying sections includes
a modulation circuit for, when the respective control signal for instructing standby or the operation is input from the control section, modulating the respective audio signal into a switching signal,
an output stage circuit for outputting the respective output signal, and
a driving circuit for, when the respective control signal for instructing the operation is input from the control section, driving the output stage circuit in response to the switching signal, and when the respective control signal for instructing standby is input from the control section, stopping the driving of the output stage circuit,
wherein
each of the first to third amplifying sections further includes,
an abnormality detecting circuit for detecting abnormality occurring in the first to third amplifying sections, and
an interface circuit that generates a protect signal representing occurrence of abnormality so as to output the signal to the control section when the respective control signal for instructing the operation is input from the control section and the abnormality detecting circuit detects abnormality, and does not generate the protect signal when the respective control signal instructing standby is input whether or not the abnormality detecting circuit detects abnormality.

2. The amplifying device according to claim 1, wherein
the modulation circuit, the driving circuit, and the abnormality detecting circuit are mounted as an integrated circuit,
the abnormality detecting circuit detects abnormality that occurs in the integrated circuit,
the integrated circuit includes
a control terminal to be connected to the interface circuit, and
a voltage control circuit that controls a voltage of the control terminal to a first voltage range when the abnormality detecting circuit detects abnormality of the integrated circuit, operates the modulation circuit and the driving circuit so as to control the voltage of the control terminal to a second voltage range when the abnormality detecting circuit does not detect abnormality in the integrated circuit, and operates the modulation circuit so as to stop the driving circuit when the voltage of the control terminal is in a third voltage range,
the interface circuit generates the protect signal when the control signal for instructing the operation is input from the control section and the voltage of the control terminal is in the first voltage range, and inputs the voltage in the third voltage range into the control terminal when the control signal for instructing standby is input.

3. The amplifying device according to claim 2, wherein
the interface circuit includes
a protect signal output terminal for outputting the protect signal,
a first transistor having a base into which the control signal is input, an emitter into which the voltage of the third voltage range is input, and a collector to be connected to the control terminal,
a second transistor having a base into which the control signal is input and which is connected to the control terminal, an emitter into which the voltage in the third voltage range is input, and a collector connected to a positive power supply, and
a third transistor having a base connected to the positive power supply and the collector of the second transistor, an emitter into which the voltage in the third voltage range is input and which is connected to the emitter of the second transistor, and a collector connected to the protect signal output terminal.

* * * * *